(12) United States Patent
Salib

(10) Patent No.: US 9,985,665 B1
(45) Date of Patent: May 29, 2018

(54) CONTROLLER, SYSTEM, AND METHOD FOR RE-ESTABLISHMENT OF COMMON MODE IN A TRANSMISSION DRIVER

(71) Applicant: Cadence Design Systems, Inc., San Jose, CA (US)

(72) Inventor: Philippe Salib, Laval (CA)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 57 days.

(21) Appl. No.: 15/282,567

(22) Filed: Sep. 30, 2016

(51) Int. Cl.
*H03K 19/0175* (2006.01)
*H03K 3/012* (2006.01)
*H04B 1/04* (2006.01)
*H04L 7/027* (2006.01)

(52) U.S. Cl.
CPC ........... *H04B 1/04* (2013.01); *H03K 19/0175* (2013.01); *H04L 7/0276* (2013.01)

(58) Field of Classification Search
None
See application file for complete search history.

(56) References Cited

U.S. PATENT DOCUMENTS 9,362,915 B1 * 6/2016 Phillippe ............ H03K 19/0175
9,705,499 B1 * 7/2017 Delage ............... H03K 19/0016

* cited by examiner

*Primary Examiner* — Jany Richardson
(74) *Attorney, Agent, or Firm* — Hunton Andrews Kurth LLP

(57) ABSTRACT

A method, control apparatus, and system for re-establishing a common mode in a transmitter involve switching a driver circuit of the transmitter to a quick charge or quick discharge mode based on an output value of the transmitter. When the output later exceeds a programmable common mode voltage, the driver circuit is switched to a classical margining mode to bring the output back towards the targeted common mode voltage. The modes are switched by adjusting the number of activated pull-up and pull-down segments. More pull-up segments and less pull-down segments are activated in the quick charge mode than the classical margining mode. More pull-down segments and less pull-up segments are activated in the quick discharge mode than the classical margining mode.

20 Claims, 13 Drawing Sheets

CONTROLLER, SYSTEM, AND METHOD FOR RE-ESTABLISHMENT OF COMMON MODE IN A TRANSMISSION DRIVER

TECHNICAL FIELD

The present invention relates to methods, devices, and systems, for output transmission drivers configured to rapidly re-establish a common mode.

BACKGROUND

The present invention relates to methods, devices, systems, and computer-readable media for transmission ("Tx") drivers in Serializer/Deserializer ("SerDes") environments. Tx drivers in SerDes environments must fulfill system and/or user requirements. These requirements ensure proper behavior of the system and the most efficient, or most responsive, Tx driver. One requirement is that transmission via the Tx driver cannot begin until the transmitter is coupled to the end-receiver. The end-receiver often includes a resistor connected to a channel that couples the Tx driver to the receiver. This resistor is known as a "Rx termination." The Tx driver is only eligible for initialization when the connection between the Tx driver and the receiver is established.

Once the connection is established between the Tx driver and the receiver, the Tx driver is initialized, and the Tx driver may either begin a transmission or revert to a low power state. Frequently, after an initialization the Tx driver is entered into a low power state and held in the low power state for a period of time. When held in the low, or the lowest, power state to preserve power, the nodes of the Tx driver are left floating and are susceptible to drift. The drift of the nodes of the Tx driver results in the nodes holding a voltage that could plausibly be any voltage in a voltage range between approximately zero and a rail voltage of the driver system. For example, the voltage at the nodes while the Tx driver is in the lowest power state could be anywhere from 0 V to $V_{DD}$.

After the Tx driver has entered a low power state, the Tx driver must resume a high power state prior to a transmission to the receiver. In particular, the output common mode must be re-established to a value that is within a range of the expected settled voltage value. In the SerDes Tx driver industry, re-establishment of the common mode to within a range of this expected settled voltage value should be completed in the shortest time possible. This increases device responsiveness to a "wake up" event. As an example, a wake up event could be, in the realm of smartphones, when a user exits a screen saver by applying a specific gesture to the smartphone's screen. The shorter the time that is required by the Tx driver to re-establish the common mode, the more quickly a device can "wake up." Some computer expansion bus standards refer to the state of the Tx driver, once it has experienced a wake up event, as an electrical idle state.

Different factors influence the speed at which Tx drivers can re-establish the common mode. One of these factors is the permitted capacitance range for the capacitor coupling the Tx driver to the receiver in the system. This coupling capacitor is referred to as an AC-capacitor. The permitted capacitance range for the AC-capacitor is generally imposed by each computer expansion bus standard. The Tx drivers must be designed so that the driver can function in the worst case scenario: the AC-capacitor value is the maximum of the permitted capacitance range. Although not constant across all computer expansion bus standards, the maximum allowable size for the AC-capacitor may be, for example, approximately 265 nF. Conventional designs of Tx drivers have been developed that are capable of re-establishment of the common mode. However, these conventional designs are only capable of achieving an electrical idle at a slow speed and with a particular circuit configuration not tailored to rapidly achieve electrical idle.

FIG. 1 illustrates a circuit 100 executing a conventional approach to the re-establishment of the common mode. The conventional approach to re-establishment of the common mode sets an H-bridge in the Tx driver to what is referred to herein as a "classical margining mode" (also known as a full margining mode). The H-bridge is modeled by circuit 100 and may include many pull-up segments in parallel with corresponding pull-down segments. For simplicity, circuit 100 is shown with only one pull-up segment and one pull-down segment. The circuit 100 includes several circuit elements: $V_{DD}$, ground, P-channel MOSFET (metal-oxide-semiconductor field-effect transistor) ("PMOS") 106, PMOS 108, resistor 128, resistor 130, N-channel MOSFET ("NMOS") 112, NMOS 114, capacitor 120, chip pin 122, chip pin 124, resistor 118, and ground 126. Circuit elements 106, 108 and 128 are connected to $V_{DD}$ at node 102, correspond to activated pull-up segments of the H-bridge, and have a collective impedance 110. Circuit elements 130, 112 and 114 are connected to ground at node 104, correspond to activated pull-down segments of the H-bridge, and have a collective impedance 116.

The total impedance associated with the H-bridge corresponds to the parallel combination of collective impedance 110 and collective impedance 116. The total impedance associated with the Rx termination is represented by the impedance at resistor 118. Generally, the number of activated pull-up and pull-down segments is selected based on a desired total impedance. Thus, an H-bridge with sixty segments might only need to activate forty segments in order to generate the desired total impedance. In classical margining, the total number of required segments is allocated between pull-up and pull-down segments so that half of the total impedance is contributed by activated pull-up segments, and half contributed by activated pull-down segments. Thus, in classical margining, collective impedance 110 is equal to collective impedance 116, and the common mode voltage of the Tx driver is $V_{DD}/2$. For example, the collective impedances 110 and 116 may each be configured to approximately $Z1=100\Omega$.

FIG. 2 illustrates a circuit 200, which is a Thevenin equivalent of circuit 100. The circuit 200 includes several circuit elements: ground 234, impedance 232, impedance 218, capacitor 220, chip pin 222, chip pin 224, ground 226, and source voltage 236. When the Tx driver is turned on to output the above-noted common mode voltage of $V_{DD}/2$, a voltage jump occurs at the Tx driver output due to the high frequency nature of the output impedance change. Because the capacitor 220 is initially at zero volts and cannot charge instantaneously, the capacitor is somewhat transparent to the jump, so that the voltages at both terminals of the capacitor are brought to an initial voltage ($V_0$).

If the impedance of the load (Rx) is matched to the impedance 232 of the Tx driver, then $V_0$ will be $V_{DD}/4$. This is due to the resistive divider formed by impedances 218 and 232. For example, if the impedance 218 was 50Ω (assuming a parallel combination of 100Ω and 100Ω in FIG. 1) and the impedance of 232 was matched to 50Ω, then the output at pins 222/224 is equivalent to current I multiplied by the impedance 218 (e.g., $V_0=I*50\Omega$). The source voltage is equivalent to current I multiplied by the sum of impedances 218 and 232 (e.g., $V_{DD}/2=I*(50\ \Omega+50\Omega)$). Solving for I in the source voltage equation, $I=(V_{DD}/2)*(1/100\Omega)=V_{DD}/200$. Substituting I into the output voltage equation, $V_0=I*50\Omega=(V_{DD}/2)*(1/100\Omega)*50\Omega$. Accordingly, $V_0=V_{DD}/4$.

After reaching $V_0$, the voltage at the output rises according to an RC curve and eventually settles to a voltage $V_s=V_{DD}/2$, at which point the common mode has been re-established. This is shown in FIG. 3.

FIG. 3 illustrates voltage at the output of the Tx driver when common mode is re-established using only classical margining. FIG. 3 illustrates a case where the floating nodes of the Tx driver output are at ground or 0 V. It is, however, possible that the floating nodes are instead closer to $V_{DD}/2$. If that were the case, the time needed to reach the settled voltage $V_s$ would be reduced since the initial voltage would be closer to the settled voltage. Therefore, FIG. 3 depicts the worst case scenario (starting from 0 V). Chart 300 depicts voltage (mV) over time (μs) for charging of the capacitor in accordance with classical margining. In the top curve, the initial voltage jump is to $V_{DD}/4$ of approximately 300 mV, followed by RC charging to settle at 689 mV. For the top curve, the common mode is reestablished to within 100 mV of the settled voltage in approximately 36 μs. The bottom curve has a lower voltage jump and lower settled voltage since the value of its Vdd is lower.

The currently available methods, systems, and devices that re-establish the common mode for TX drivers are slow. Therefore, there is a need for methods, systems, and devices that are capable of rapidly re-establishing the common mode for Tx drivers. In addition, the functionality to rapidly re-establish the common mode should minimize additional hardware while continuing to meet system requirements.

SUMMARY

In view of the foregoing, an objective according to one aspect of the present disclosure is to provide device configurations and methods for re-establishing a common mode of a transmission driver. In particular, embodiments of the invention relate to successively executing different charging or discharging schemes, or modes, by selectively activating and deactivating pull-up and pull-down segments of the transmission driver such that the charging current is higher for a period of time, as compared to the charging current provided through classical margining.

In an example embodiment, a Tx driver includes at least one reconfigurable circuit (e.g., an H-bridge) that generates an output of the output driver. A method to re-establish a common mode across a capacitor situated on a channel connecting the Tx driver to a receiver termination includes determining whether the Tx driver is requested to establish an electrical idle state, and measuring a first signal value (a voltage or a current) at the output of the Tx driver. A control device establishes first and second reference values, and a comparator compares the first signal value to the first reference value. Based on the comparison, the control device may configure the reconfigurable circuit as a quick charge circuit or a quick discharge circuit. The method further includes measuring, at the output of the Tx driver, at least one subsequent signal value, and comparing the at least one subsequent signal value to the second reference value. Based on the subsequent comparison, the control device may either (i) maintain the existing circuit configuration and repeat the subsequent comparison after a period of time or (ii) configure the reconfigurable circuit as a classical margining circuit.

To switch the reconfigurable circuit to a quick charge mode, the control device may activate at least one additional pull-up segment (e.g., one or more sets of PMOS transistors) in combination with deactivating at least one pull-down segment (e.g., one or more sets of NMOS transistors). Similarly, to transition the reconfigurable circuit to a quick discharge mode, the control device may activate at least one additional pull-down segment in combination with deactivating at least one pull-up segment. Preferably, all of the activated segments are performing the same action (all pulling down or all pulling up). In this manner, the charging current is increased.

DESCRIPTION OF EXEMPLARY EMBODIMENTS

The following description of exemplary embodiments provides non-limiting representative examples referencing numerals to particularly describe features and teachings of the invention. The embodiments described should be recognized as capable of implementation separately, or in combination, with other embodiments from the description of the exemplary embodiments. A person of skill in the art reviewing the description of exemplary embodiments should be able to learn from and understand the different described aspects of the invention. The description of exemplary embodiments should facilitate understanding of the invention to such an extent that other implementations of the invention, not specifically covered but within the knowledge of a person of skill in the art having read the description of exemplary embodiments, would be understood to be consistent with an application of the invention.

Figure 4:
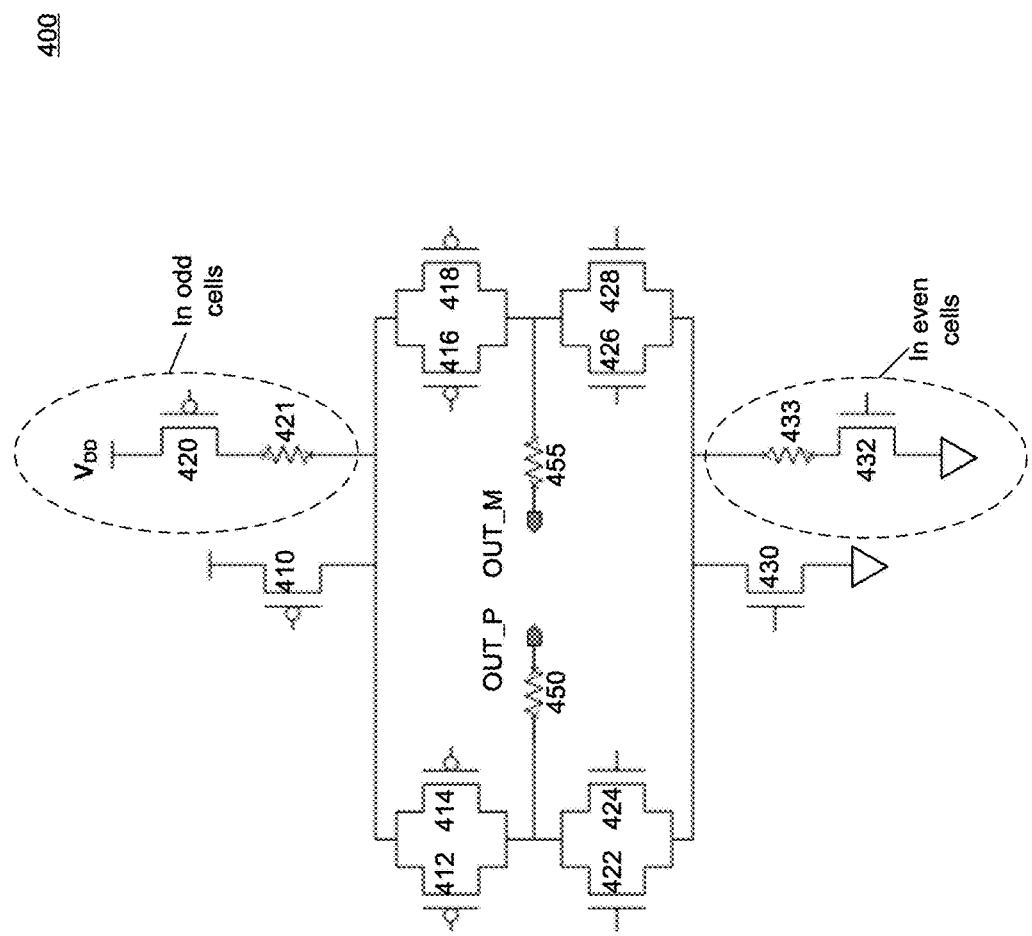
FIG. 4 illustrates a circuit for fast re-establishment of the common mode.
Figure 11:
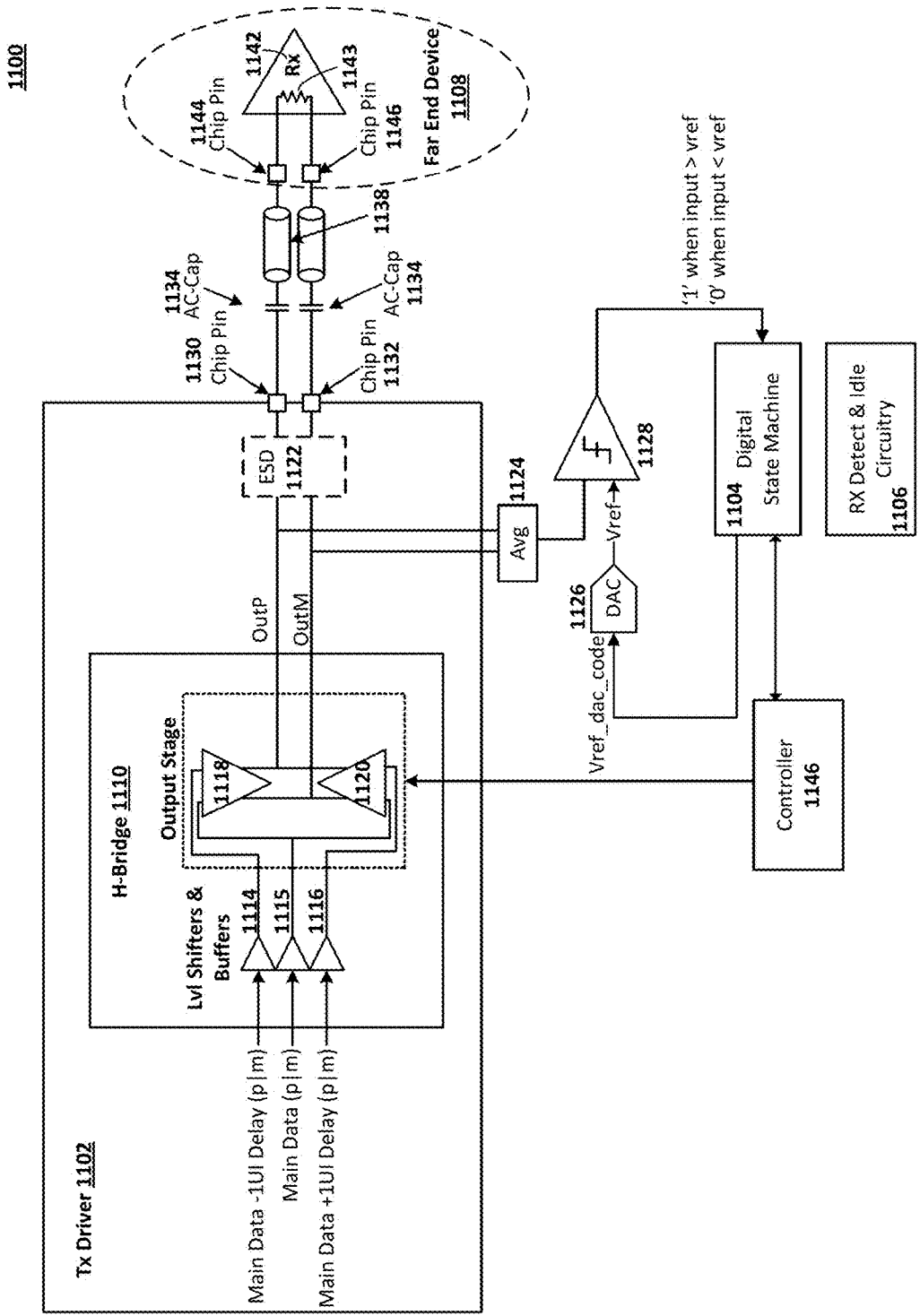
FIG. 11 illustrates a system for fast re-establishment of the common mode.

FIG. 4 illustrates a circuit 400 for fast re-establishment of the common mode. In an embodiment, a Tx driver may include multiple H-bridges, each H-bridge including a plurality of even cells paired with corresponding odd cells. In each H-bridge, the odd and even cells are connected at a positive output terminal OUT_P and at a negative output terminal OUT_M. The circuit 400 represents both types of cells and includes a plurality of pull-up devices (PMOS 410, 412, 414, 416 and 418) and a plurality of pull-down devices (NMOS 422, 424, 426, 428, and 430). For even cells, the circuit 400 includes an additional NMOS 432 connected between a resistor 433 and ground. For odd cells, the circuit includes an additional PMOS 420 connected between a resistor 421 and $V_{DD}$. PMOS 412, 414, 416 and 418 share a common source. Likewise, NMOS 422, 424, 426 and 428 share a common source. PMOS 412, PMOS 414, NMOS 422 and NMOS 424 share a common drain connected to OUT_P. Similarly, PMOS 416, PMOS 418, NMOS 426 and NMOS 428 share a common drain connected to OUT_M. PMOS 412, 414, 416 and 418 are connectable to $V_{DD}$ through PMOS 410 and, in an odd cell, through PMOS 420. NMOS 422, 424, 426 and 428 are connectable to ground through NMOS 430 and, in an even cell, through NMOS 432. The gate inputs of the pull-up and pull-down devices may be individually controlled using control signals output by a control device (not shown). The control device may include a state machine that switches the circuit 400 between classical margining mode, quick charge mode, and quick discharge mode, and a controller circuit that issues commands to the Tx driver to switch or maintain operating modes depending on the current state. An example control device is shown in FIG. 11.

Figure 1:
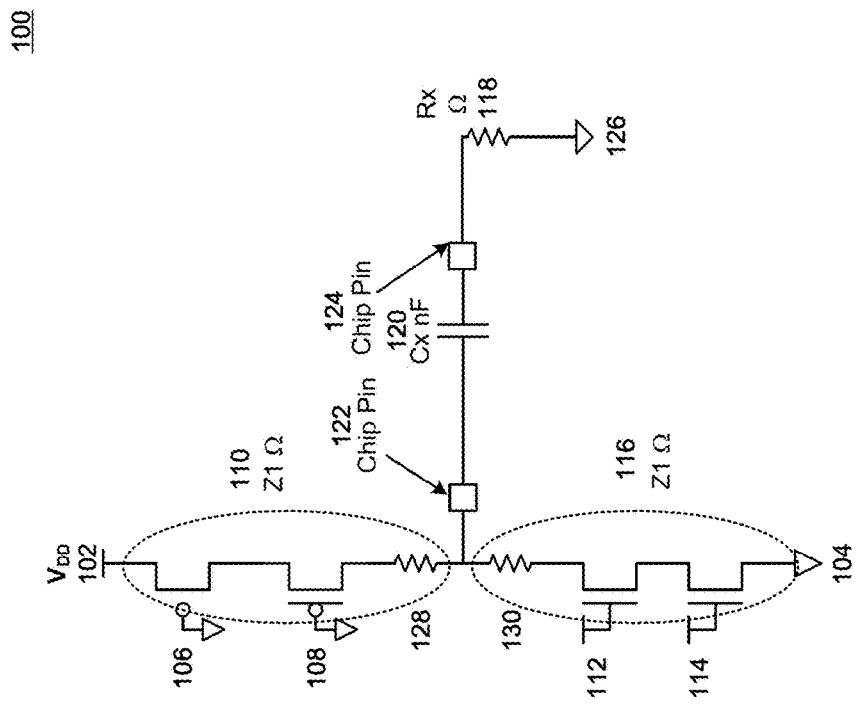
FIG. 1 illustrates a circuit executing a conventional approach to the re-establishment of the common mode.
Figure 5:
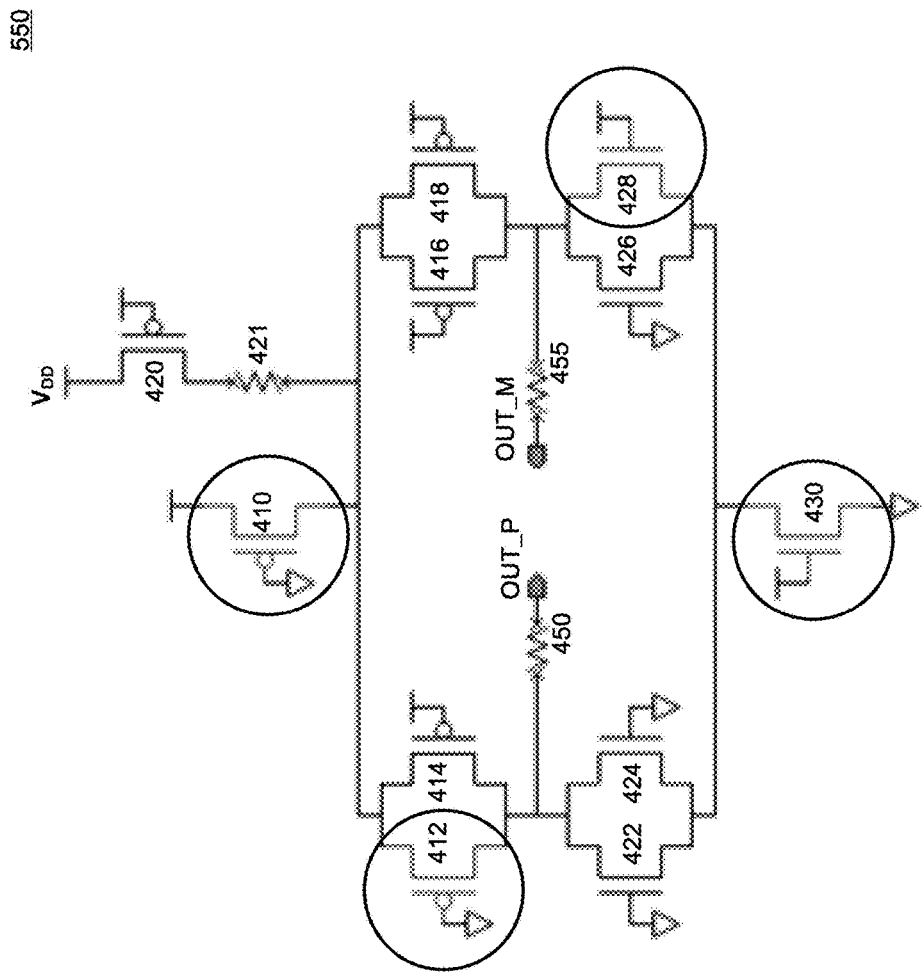
FIG. 5 depicts a first configuration of a circuit for fast re-establishment of the common mode.

FIG. 5 illustrates an odd cell 550 in a classical margining mode. The circled devices may be activated by setting their respective gate inputs to ground if the device is PMOS or to $V_{DD}$ if the device is NMOS. PMOS 410, PMOS 412, NMOS 428 and NMOS 430 are activated. All other depicted MOS devices are deactivated. A counterpart configuration exists for an even cell (not shown) paired with the odd cell 550, where PMOS 410, PMOS 418, NMOS 422 and NMOS 430 are activated. When the odd cell and its paired even cell are configured in this manner, the resulting circuit is similar to that of the classical margining circuit 100 in FIG. 1. For OUT_P, PMOS 410 and 412 in the odd cell will correspond to PMOS 106 and 108. NMOS 422 and 430 in the even cell will correspond to NMOS 112 and 114. Similarly, for OUT_M, PMOS 410 and 418 in the even cell will correspond to PMOS 106 and 108, and NMOS 428 and 430 in the odd cell will correspond to NMOS 112 and 114. Thus, an H-bridge can be implemented as a circuit that is reconfigurable to perform, amongst other things, classical margining.

Figure 6:
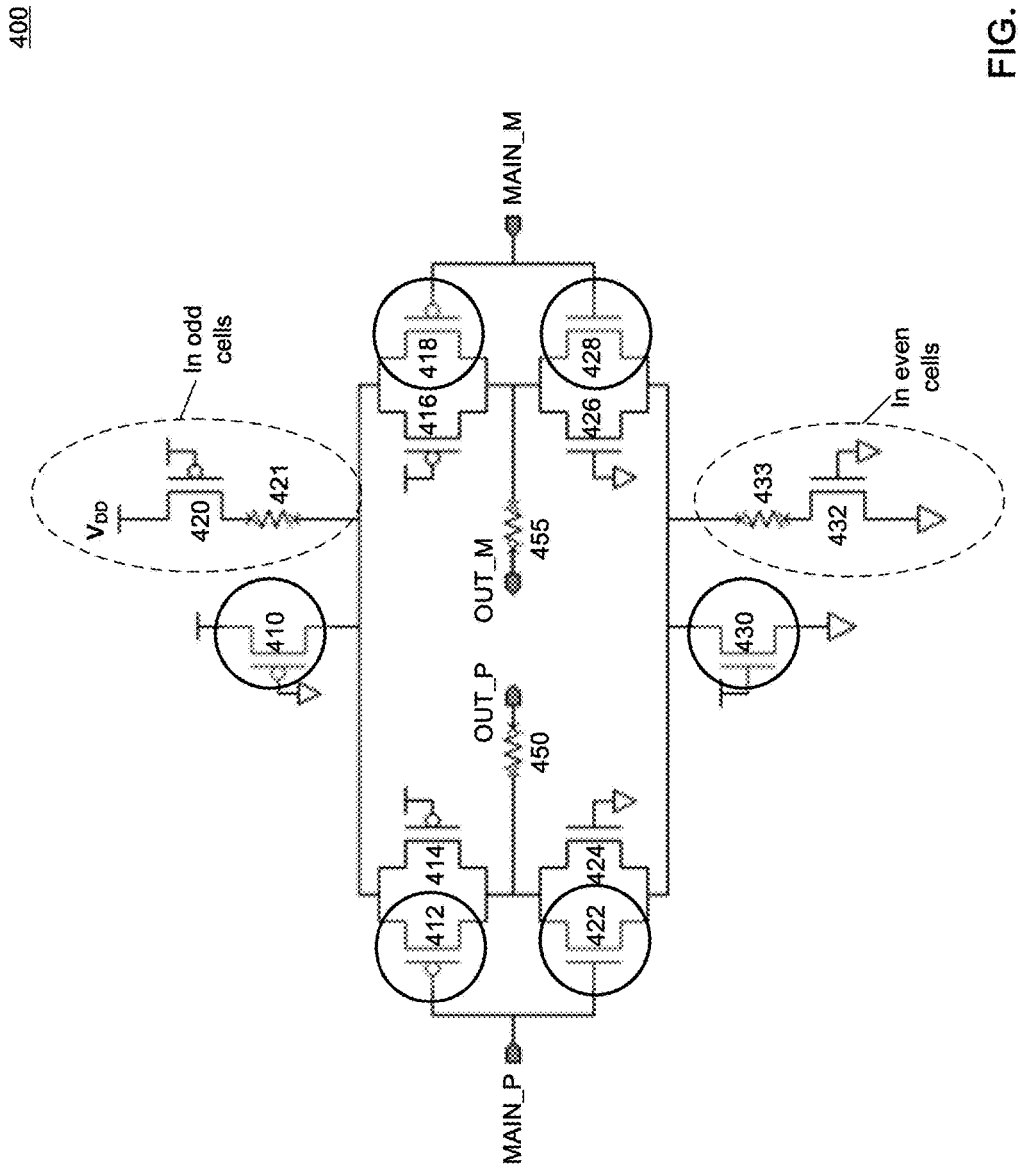
FIG. 6 depicts a second configuration of a circuit for fast re-establishment of the common mode.

FIG. 6 illustrates the circuit 400 when configured for fast re-establishment of the common mode. PMOS 410 and NMOS 430 are activated. PMOS 412, PMOS 418, NMOS 422 and NMOS 428 are activated depending on the states of control signals MAIN_P and MAIN_M, which vary depending on whether the circuit 400 is being set to charge or discharge. Each of the control signals MAIN_P and MAIN_M will drive either a logical 1 or a logical 0. Thus, for example, if MAIN_P activates PMOS 412, then NMOS 422 will be deactivated and vice versa. Since the even cells are driven by MAIN_P and MAIN_M in the same manner as the odd cells, a pull-up device activated in an odd cell will also be activated in the corresponding even cell. Similarly, a pull-down device activated in the odd cell will be activated in the corresponding even cell.

Figure 7:
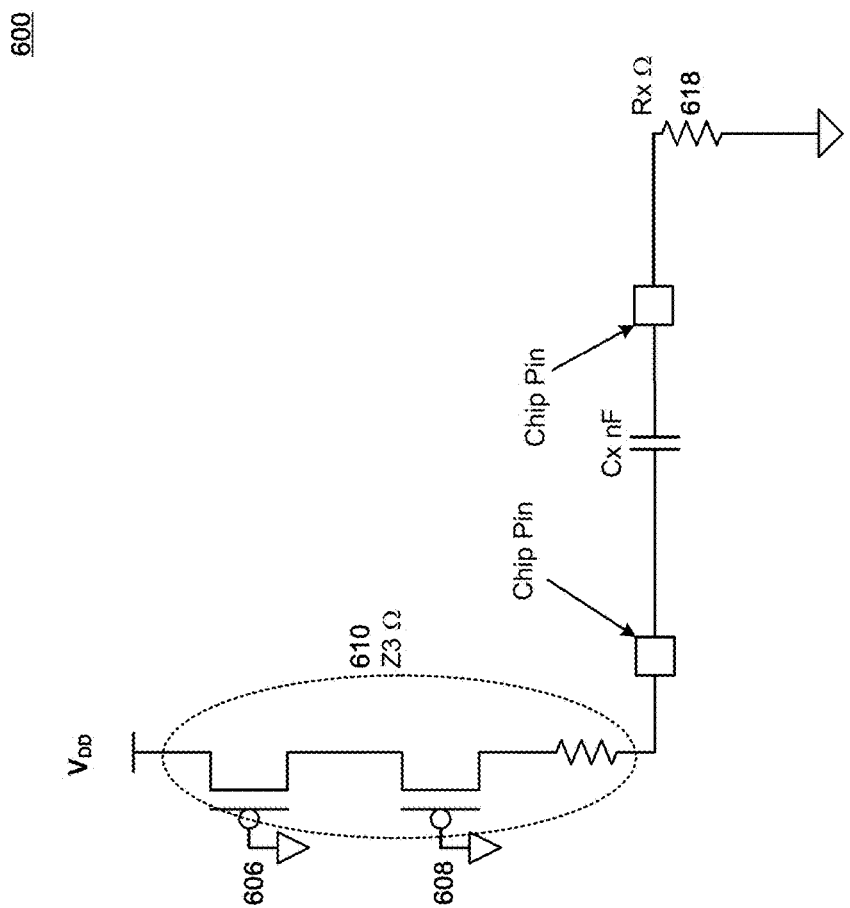
FIG. 7 depicts a circuit representing a Tx driver during a quick charge mode.

FIG. 7 illustrates a circuit 600, which represents the Tx driver during a quick charge mode, e.g., when the H-bridges of the Tx driver are configured according to FIG. 6. The total impedance associated with the Tx driver is represented by the impedance at collective impedance 610. The total impedance associated with the Rx termination is represented by the impedance at resistor 618. The impedance of the Tx driver is set in this instance by activating a set of pull-up segments, without activating any pull-down segments. For simplicity, only one segment is shown, formed by PMOS 606 and PMOS 608. Referring back to FIG. 6, PMOS 606 may correspond to PMOS 410, and PMOS 608 may correspond to PMOS 412 or 418. Analogously, a quick discharge mode may involve activating a set of pull-down segments, without activating pull-up segments.

Figure 8:
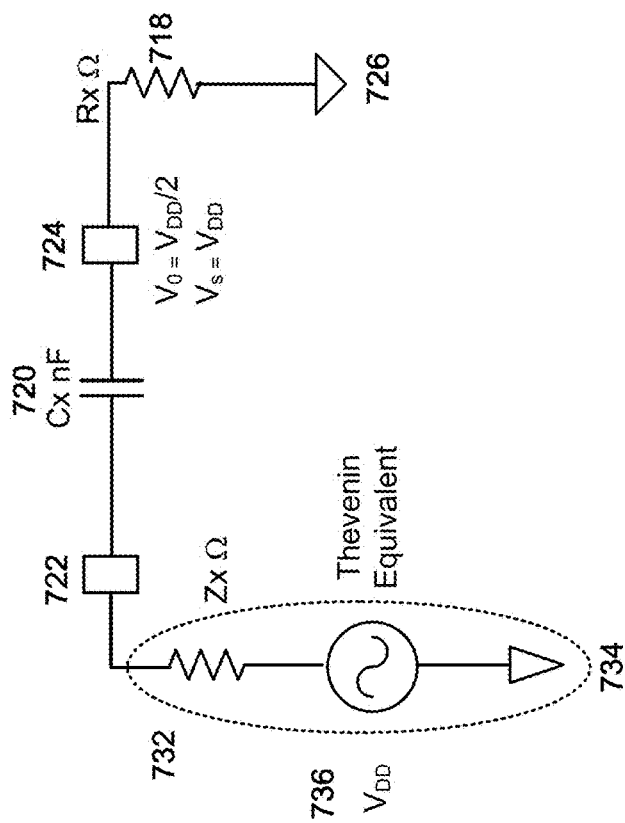
FIG. 8 depicts a Thevenin equivalent of the circuit of FIG. 7.

FIG. 8 illustrates a circuit 700, which depicts a Thevenin equivalent of circuit 600. The circuit 700 includes several circuit elements: ground 734, impedence 732, impedence 718, capacitor 720, chip pin 722, chip pin 724, ground 726, and supply source 736. Circuit impedance 732 is matched to the impedance 718.

Figure 2:
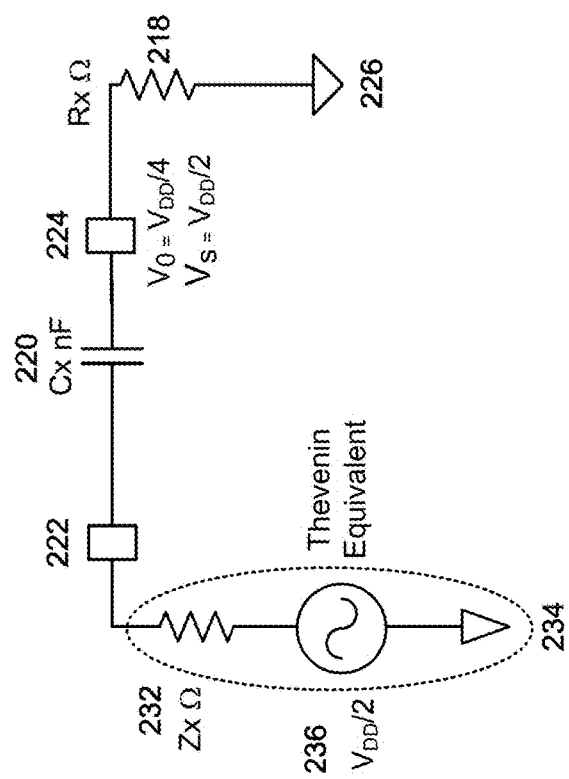
FIG. 2 depicts a Thevenin equivalent of the circuit of FIG. 1.
Figure 3:
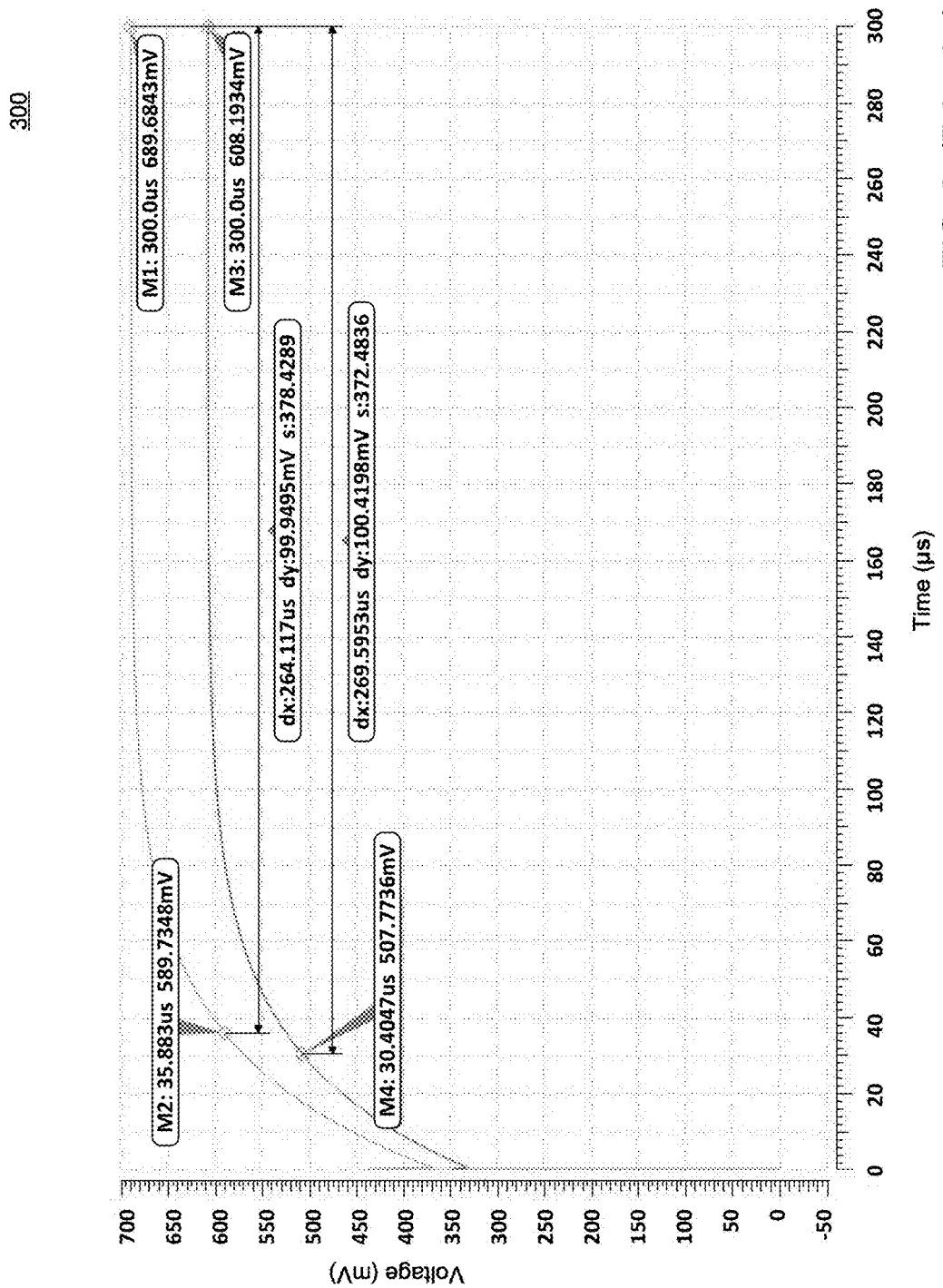
FIG. 3 is a graph of a capacitor voltage when classical margining is used.

The impedence 732 may be same as impedance 232 in FIG. 2. In other words, the output impedance of the Tx driver may remain the same despite changing from classical margining to a quick charge or quick discharge configuration. However, the voltage of source 736 is significantly greater, in this instance double that of source 236 in FIG. 2 ($V_{DD}$ versus $V_{DD}/2$). This is due to having all the activated segments pulling up instead of half up and half down. With all activated segments pulling up, the charging current is doubled. Consequently, an initial voltage $V_0$ of $V_{DD}/2$ develops at the terminals of the capacitor 720, and the settled voltage $V_s$ is $V_{DD}$. Thus, the initial voltage jump is higher compared to when using classical margining, reducing the amount of time needed to charge the capacitor.

If quick charge mode were maintained, the Tx driver output would settle at $V_{DD}$, which is well above the voltage level at which the common mode is re-established (i.e., $V_{DD}/2$). Therefore, to efficiently and rapidly re-establish the common mode, the mode may be switched from the quick charge mode to a second mode. In some embodiments, the second mode is the classical margining mode. The timing of the switch from the quick charge mode to the second mode may be determined by a control device in the Tx driver.

Figure 9:
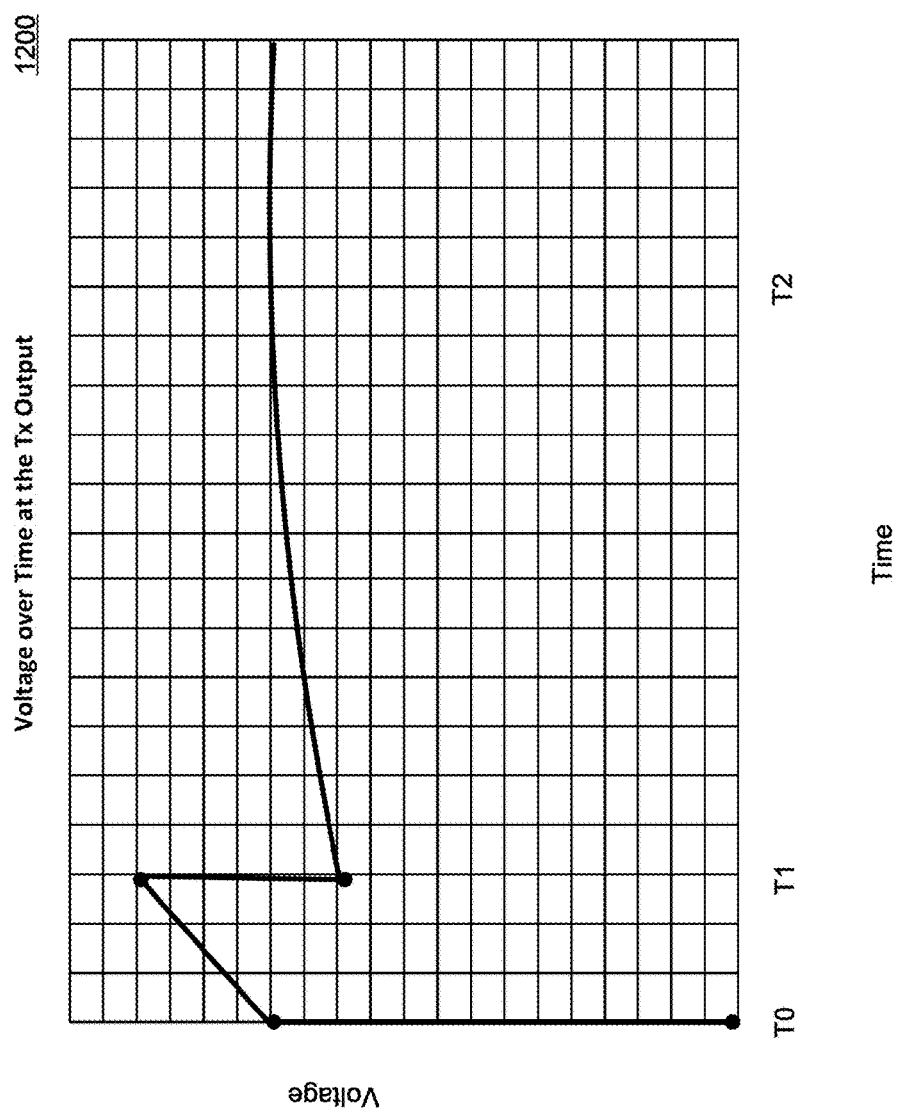
FIG. 9 is a graph depicting voltage at a Tx driver output during fast re-establishment of the common mode.

FIG. 9 illustrates chart 1200 depicting voltage change over time, measured at the Tx driver output during fast re-establishment of the common mode, and assuming an initial voltage of 0V both at the Tx output and across the AC-capacitor. At T0, the capacitor is transparent, leading to a voltage jump in which the voltage at the Tx driver output rapidly rises to $V_{DD}/2$. Shortly thereafter, the capacitor becomes apparent and the voltage at the Tx driver output charges towards $V_{DD}$. After detecting at T1 that the voltage at the output has passed a programmable reference voltage higher than $V_{DD}/2$ (e.g., $3V_{DD}/4$), the Tx driver is switched to classical margining mode, causing a slight drop in the voltage at the output. The determination that the voltage at the output has passed the programmable reference voltage can be made by evaluating the voltage at the Tx driver output against a threshold equal to the programmable reference voltage. Alternatively, the voltage at the Tx driver output may be inferred by evaluating the voltage at the capacitor against a corresponding threshold. In the example of FIG. 9, when the voltage at the Tx output is $3V_{DD}/4$, the corresponding voltage across the capacitor may be approximately $V_{DD}/2$. Once this condition is met (e.g., the Tx driver output measures at $3V_{DD}/4$, which will correspond to a voltage across the capacitor of approximately $V_{DD}/2$), a controller circuit reconfigures the H-bridges to the second mode. At T2, in the second mode, the Tx driver output voltage settles to the common mode voltage.

Figure 10:
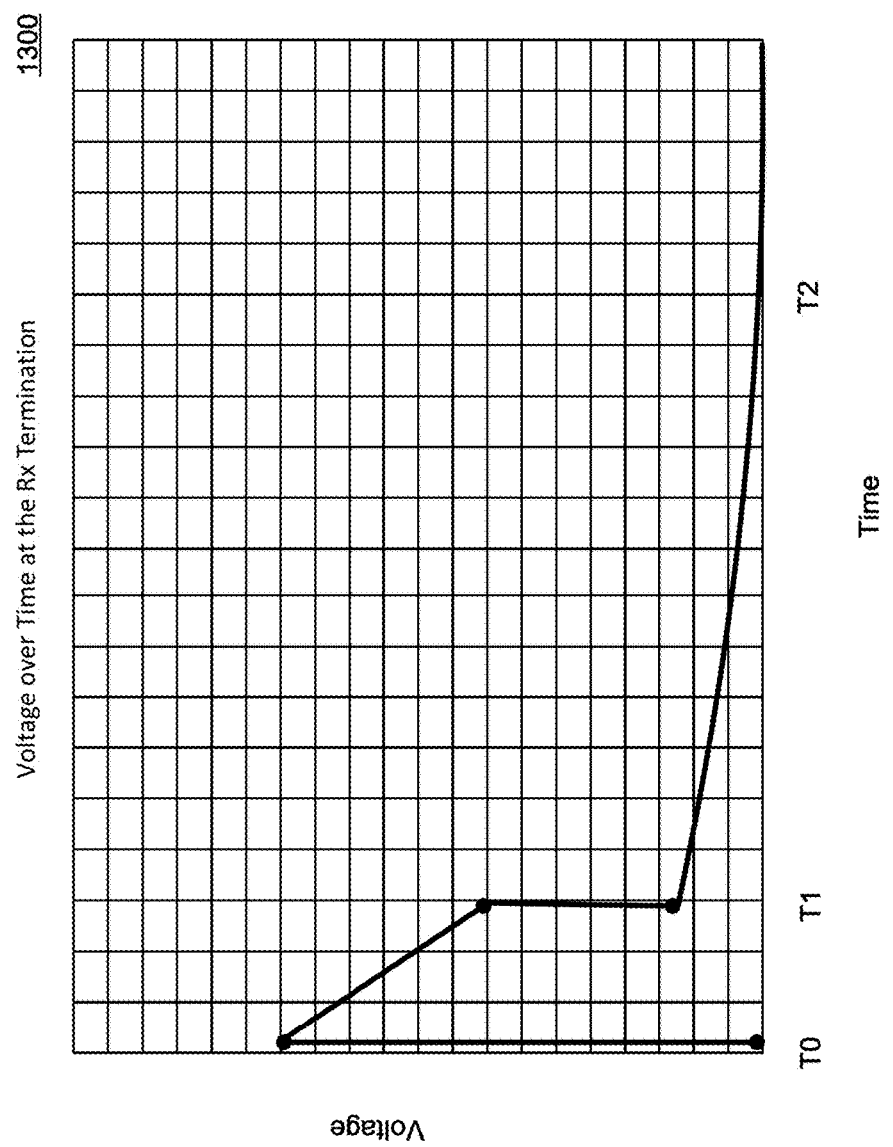
FIG. 10 is as graph depicting voltage at a Rx termination during fast re-establishment of the common mode.

FIG. 10 illustrates chart 1300 depicting voltage change over time, measured at the Rx termination during fast re-establishment of the common mode, and assuming an initial voltage of 0V both at the Tx output and across the AC-capacitor. At T0, the H-bridges are configured to a quick charge mode and the capacitor is transparent, leading to a voltage jump in which the voltage at the Rx termination rises to $V_{DD}/2$. Shortly thereafter, the capacitor becomes apparent. The voltage on the Rx termination discharge towards ground through the Rx termination, from $V_{DD}/2$ towards $V_{DD}/4$. At T1, the controller switches the mode from a quick charge mode to the second mode in response to detecting that the voltage at the output of the Tx driver has passed a programmable reference voltage higher than $V_{DD}/2$. As mentioned above, this condition may be detected at the Tx driver output or at the capacitor. Alternatively, it may be detected based on a measurement of the voltage at the Rx termination side, which is Vdd/4. Once this condition is met (e.g., Rx termination side measures at $V_{DD}/4$, which will correspond to a voltage across the capacitor of approximately $V_{DD}/2$), the controller issues a command to change the H-bridges to the second mode. At T2, in the second mode, the Rx termination voltage settles to ground.

FIG. 11 illustrates a system 1100 for fast re-establishment of the common mode. The system 1100 includes a Tx driver 1102 and a far end device 1108. The device 1108 includes a receiver 1142 connected by a channel 1138. The input impedance of the receiver is represented by a Rx termination 1143. The channel 1138 implements differential signaling. Such a connection is commonly referred to as a unidirectional link. Two unidirectional links which have data flowing in opposite directions over two distinct physical channels may form a bidirectional link. In some embodiments, two such links share a common physical channel by "taking turns", a configuration known as half-duplex link.

Data is transmitted at a specified symbol rate, the inverse of which defines a duration known as a unit interval (UI). The Tx driver 1102 may be configured to selectively drive emphasis data from an earlier UI (post-cursor) and/or from a subsequent UI (pre-cursor) in order to attempt to achieve settled voltage values in a more reliable manner. Post-cursor emphasis is introduced by blending the main data signal stream with a delayed version of the main data signal stream (known as post-cursor data). Pre-cursor emphasis is introduced by blending the main data signal with an advanced version of the main data signal stream (known as pre-cursor data). In addition, the final signal may be subjected to weighting criteria for each of the UIs. For example, a final data signal could be described as $C_{-1}$*(Pre-cursor data)+ $C_0$*(Main data)+$C_1$ (Post-cursor data), where $C_{-1}$, $C_0$, and $C_1$ are weighting coefficients. Manipulation of the data in this manner may reduce channel attenuation.

The Tx driver 1102 includes an H-bridge circuit 1110 that accepts main data together with emphasis data. The main data in some embodiments includes only a data signal. In some embodiments, and depending upon the SerDes environment, the main data includes at least the data signal and a clock signal associated with the data signal. In some embodiments, the assignment of the main data to each individual Tx driver 1102 segment is automatically selected according to the system needs or requirements. For example, the initialization of a link between the Tx driver and the receiver may not utilize all of the segments available in the Tx driver 1102. Therefore, the main data can be automatically provided to only those segments that are configured during the initialization to be active segments.

The H-bridge 1110 forms the output stage of the Tx driver and transmits the main data over channel 1138 to the far end's (1108) receiver 1142. Emphasis data, which includes the pre-emphasis and post-emphasis data described earlier, is combined with the main data at the output stage and transmitted over channel 1138. The main data and the emphasis data may be transmitted to the H-bridge along independent paths. For example, the pre-cursor data, main data, and post-cursor data may be transmitted to respective level shifters and buffers 1114, 1115 and 1116 in the H-bridge. The level shifters resolve any mixed voltage incompatibilities between the data source and the H-bridge associated with the channel in the event these operate off power supplies with different voltage values. The level shifters may be unidirectional level shifters. In some embodiments, a level shifter is one of a bi-directional level shifter (if the connection between the Tx driver output and the receiver is bidirectional), a direction-controlled level shifter, a logic level shifter, or an application-specific level shifter. In some embodiments, the level shifters 1114 to 1116 may synchronize data from one channel to data from other channels.

The level shifters 1114 to 1116 supply level shifted main and emphasis data to the output stage, which blends the level shifted data using a plurality of banks. Each bank may include two input paths, with each path being permanently tied or connected by a switch to one of the data signals. For example, a first bank 1118 may include paths for selectively driving main and pre-cursor data, while a second bank 1120 selectively drives main and post-cursor data. The banks 1118 and 1120 need not be identical. One bank may, for example, include more segments than the other bank. Alternative output stage arrangements are possible, such as single bank with three input paths for selectively driving all three data signals. Each bank 1118, 1120 is connected to chip pins 1130 and 1132 and therefore able to drive a data signal onto either pin.

The output from each of the banks 1118, 1120 is averaged by an averaging device 1124. In some embodiments, the averaging device includes at least one operational amplifier that computes an average of the signals provided at the output of Tx driver 1102, as well as any additional outputs from Tx drivers provided for up to N channels.

The averaging device 1124 provides the average as an analog input to comparator 1128. A reference signal is provided as a second input to the comparator 1128. The comparator 1128 compares the output of averaging device 1124 to the reference signal. When the output of the averaging device 1124 exceeds the reference signal, the comparator outputs a high signal, or a logical 1. When the output of the averaging device 1124 is less than the reference signal, the comparator outputs a low signal, or a logical 0. In alternative embodiments, the outputs may be reversed so that a high signal is output when the output of the averaging device 1124 is less than the reference signal and a low signal is output when the output of the averaging device 1124 exceeds the reference signal.

Digital state machine 1104 provides a digital code, representing a desired reference value, to the Tx driver. The digital state machine 1104 is initially configured to supply a first reference value for determining whether or not the H-bridge circuits should be configured to a quick charge mode or a quick discharge mode. The output of the comparison is received by the digital state machine 1104 and transmitted to controller 1146. Based on the output from the digital state machine 1104, the controller 1146 adjusts switches in the Tx driver to configure the H-bridges in each active channel (e.g., switches in the segments of banks 1118 and 1120).

After a time period has passed with the capacitor charging according to the quick charge mode or discharging according to the quick discharge mode, digital state machine 1104 supplies a second reference value for determining whether the H-bridge circuits should remain in the previously configured mode or switch to a second mode. When the output of the comparison with the second reference value indicates that the H-bridge circuits should switch to the second mode, the digital state machine 1104 and the controller 1146 communicate and the controller 1146 adjusts switches to configure the H-bridges to the appropriate circuit for the requested mode, e.g., classical margining mode.

The reference values supplied by the digital state machine 1104 are supplied in the form of digital codes. To translate the digital codes to analog signals for the comparison, the digital state machine 1104 sends the codes to a digital to analog converter ("DAC") 1126. The codes are depicted in FIG. 11 as "Vref_dac_code." The DAC 1126 supplies the analog reference signal to comparator 1128 for the comparison. In some embodiments, the comparator 1128 is borrowed from another sub-system and is used for other purposes besides common mode re-establishment. For example, the comparator 1128 may be a comparator within an Rx Detect & Idle Circuitry 1106, which uses the comparator 1128 to detect the presence or absence of a receiver prior to (or after) common mode re-establishment.

The Tx driver 1102 may include an electro-static discharge (ESD) circuit 1122 that protects the Tx driver against ESDs.

Chip pin 1130 is where Tx driver 1102 outputs to a first polarity (e.g., the plus polarity) of channel 1138. Chip pin 1132 is where Tx driver 1102 outputs to a second polarity (e.g., the minus polarity) of channel 1138. Pins 1130 and 1132 are where the averaging device 1124 obtains measurements to derive an input to comparator 1128. Chip pin 1144 is where the Rx termination receives input on the first polarity of channel 1138. Chip pin 1146 is where the Rx termination receives input on the second polarity of channel 1138. Pins 1144 and 1146 can be used as alternative or additional measuring points. Each polarity of the channel 1138 has a respective AC capacitor 1134. The capacitors 1134 can be located either on the Tx or Rx side of the system 1100, and the voltages that the capacitors hold indicate whether the capacitors have sufficient charge to induce an electrical idle state.

Once electrical idle is achieved, regular data transmissions between the Tx driver 1102 and the receiver 1142 may be initiated. The impedance of the Rx termination 1143 can be established according to requirements designated by the SerDes target environment. In some embodiments, the receiver 1142 has a termination impedance 1143 ranging from 80Ω to 120Ω. As described earlier, the impedance of the Tx driver, which is determined by the internal configuration of the H-bridge segments in the banks 1118 and 1120, can be matched to the impedance at the Rx termination.

Figure 12A:
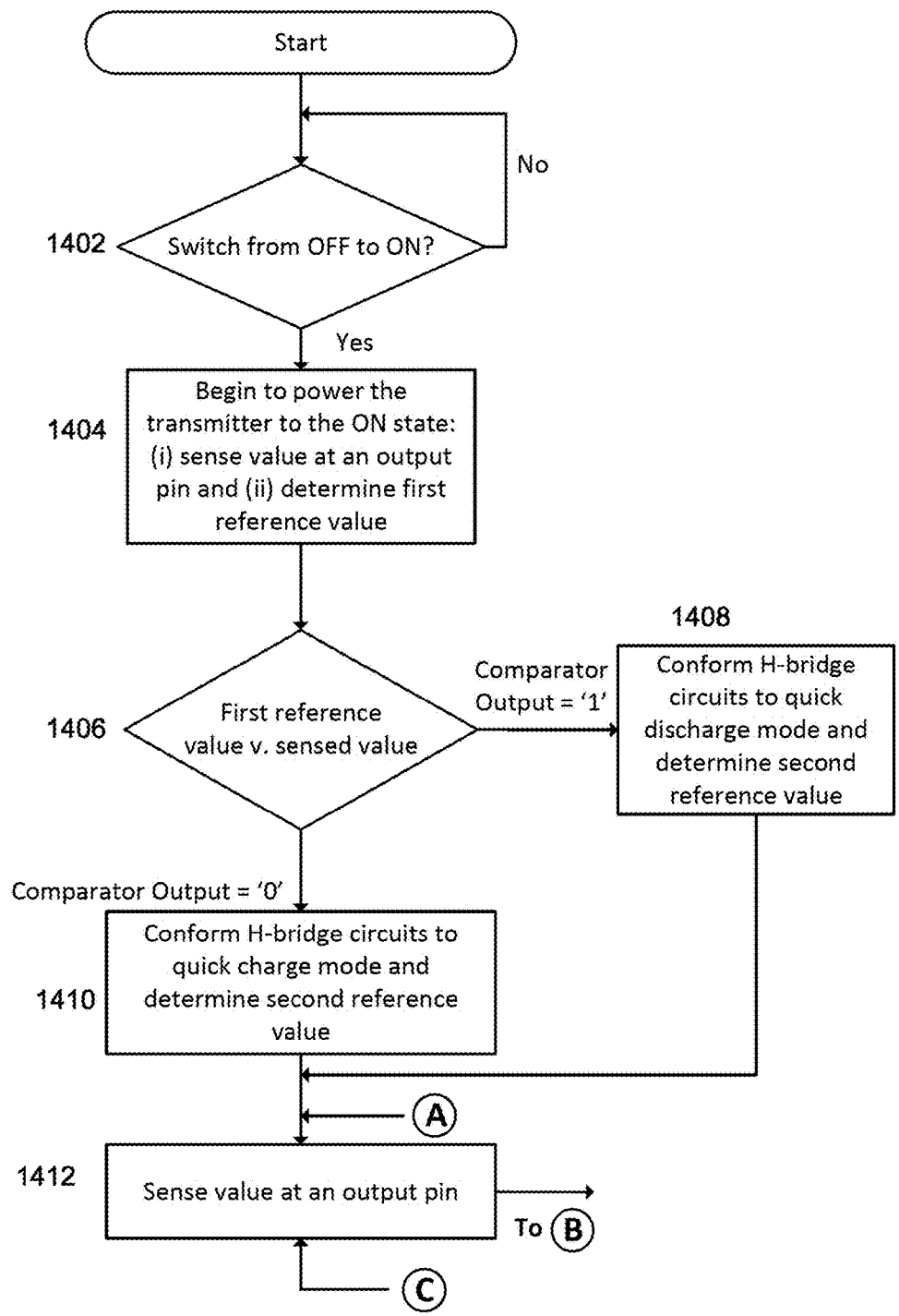
FIGS. 12A and 12B illustrate a method for fast re-establishment of the common mode.
Figure 12B:
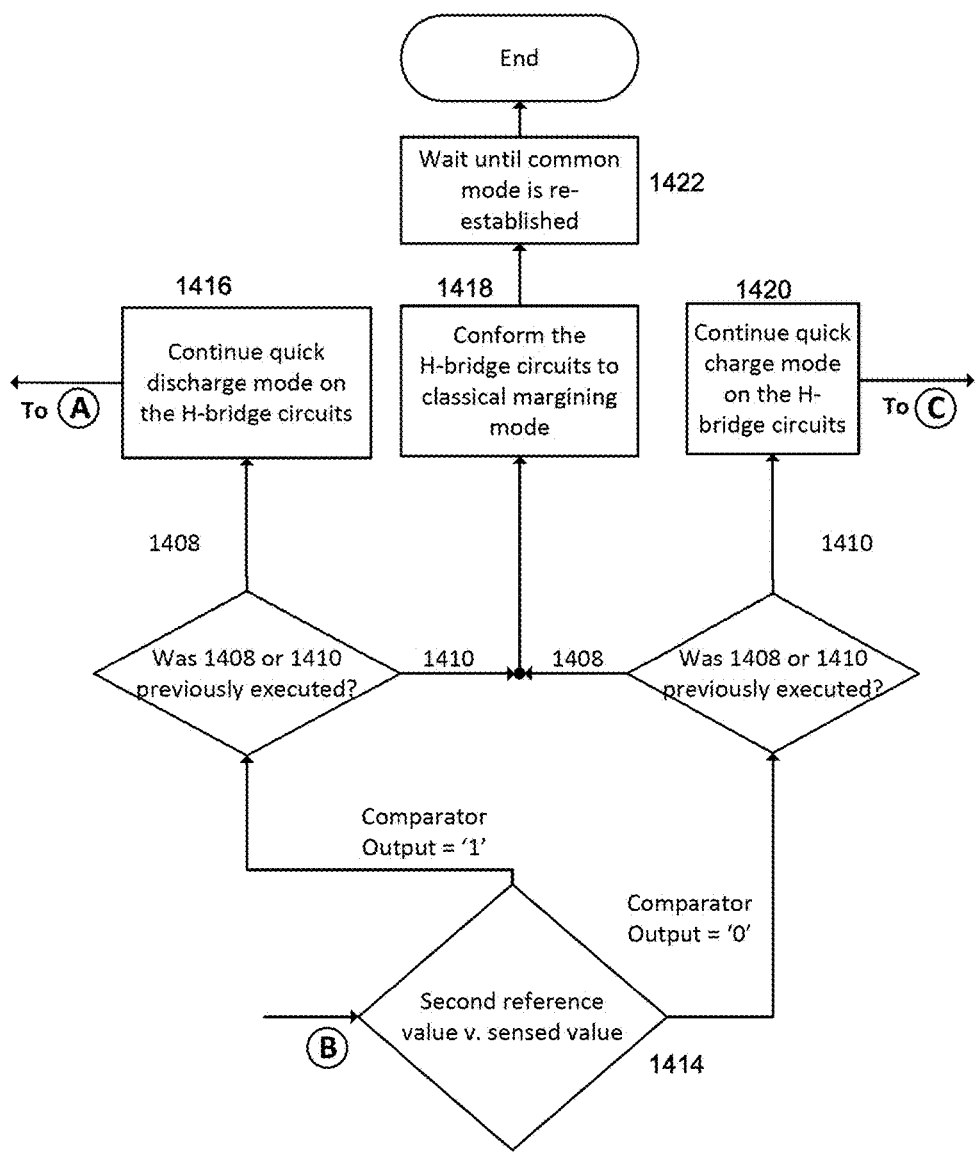

FIGS. 12A and 12B illustrate a method 1400 for fast re-establishment of the common mode. The method involves adjusting the H-bridges in the Tx driver from a first mode (a quick charge mode or a quick discharge mode) to a second mode. At step 1402, it is determined whether the transmitter is switched from an "OFF" (high impedance) state to an "ON" state. An "OFF" state may refer to the lowest power state of the Tx driver or a component associated with the Tx driver. The Tx driver, while OFF, has at least one output pin that is floating. Due to the floating output pin, the value of the signal at the output pin of the Tx driver is unknown, except for the fact that it is in a range between a lowest possible value (e.g., ground) and a highest possible value (e.g., $V_{DD}$). When ON, the Tx output may execute a transition to an electrical idle state.

If the determination from step 1402 indicates that there is no transition from an OFF state to an ON state, or indicates that no such transition has been requested, the method returns to 1402. The determination from step 1402 may be executed at regular intervals.

After the determination indicates that there is a transition from the OFF state to the ON state, the transmitter begins to power to the ON state. The powering to the ON state is completed, consistent with the above discussion, by switching to the quick charge mode (or quick discharge mode, if necessary), and then switching to the classical margining mode. During the powering up, at least one pin at the Tx driver output is subjected to sensing (step 1404). The sense value may be a voltage value ($V_{sensed}$). Alternatively, the sensed value may be a current value ($I_{sensed}$). With regard to FIG. 11, the at least one pin for sensing may correspond to either 1130 or 1132.

In some embodiments, during the powering up, further elements of the system are enabled, including at least one of: a DAC (e.g., DAC 1126), a comparator (e.g., comparator 1128), and a comparator clock (not shown). In some embodiments, two pins are used for the sensing (e.g., 1130 and 1132, 1130 and 1144, or 1132 and 1146).

Also at step 1404, digital state machine 1104 determines a first reference value, $V_{RefOne}$ or $I_{RefOne}$, e.g., by reading a stored value from a memory or a look-up table. The stored reference values may have been calculated as a function of $V_{DD}$ and then programmed or hard coded into the Tx driver. For example, the first reference value may have been set at $V_{DD}/2$.

At step 1406, the value sensed at the at least one pin is compared to the first reference value, e.g. comparing a sensed voltage value to $V_{RefOne}$ at comparator 1128 or, alternatively, comparing a sensed current to $I_{RefOne}$. The sensed value need not be directly input to the comparator. Instead, it is possible to perform the comparison on a value derived from the sensed value, such as the output of the averaging device 1124 in FIG. 11.

The comparator outputs a signal that is one of high ("1") or low ("0"). The output of the comparator is high if the value provided from the at least one pin exceeds the first reference value (e.g., $V_{sensed} > V_{RefOne}$) and the output of the comparator is low if the value provided from the at least one pin is less than the first reference value (e.g., $V_{sensed} < V_{RefOne}$).

When the value provided from the pin exceeds the first reference value, the method proceeds to step 1408, where a transition is made to the quick discharge mode. At 1408, the H-bridges of the Tx driver are configured such that the active segments are all pull-down. In addition, a second reference value (e.g., $V_{RefTwo}$ or $I_{RefTwo}$), is determined, e.g., in the same way as the first reference value. Since the result of the comparison was high, the second reference value is set to be less than the first reference value. For example, the reference value may be set at $V_{DD}/4$.

When the value provided from the pin is less than the first reference value, the method proceeds to step 1410, where a transition is made to the quick charge mode. At step 1410, the H-bridges of the Tx driver are configured such that the active segments are all pull-up. In addition, a second reference value, $V_{RefTwo}$ or $I_{RefTwo}$, is determined. Since the result of the comparison was low, the second reference value is set to be greater than the first reference value. For example, the second reference value in this instance may be set to $3V_{DD}/4$.

In steps 1408 and 1410, not all of the active segments need to be performing the same action (pull-up or pull-down). For example, in some embodiments, only a majority of the active segments are pulling up or pulling down, consistent with the selected mode. Generally, the quick charge and quick discharge modes are distinguished from the classical margining mode in that more pull-up segments and less pull-down segments are activated in the quick charge mode than the classical margining mode, and more pull-down segments and less pull-up segments are activated in the quick discharge mode than the classical margining mode. The net result is that the charging or discharging current is increased.

At step 1412, the at least one pin on the output is again subjected to sensing.

At step 1414, the value sensed at the at least one pin is compared, at a second comparator, to the second reference value determined at step 1408 or step 1410. The comparison in step 1414 may occur at a preset time after the comparison of step 1406, the initiation of the pull-down activity at step 1408, or the initiation of the pull-up activity at step 1410. The second comparator may, but need not, be the same as the comparator used in step 1406. The output of the second comparator is high if the value provided from the at least one pin exceeds the second reference value (e.g., $V_{sensed} > V_{RefTwo}$) and the output of the second comparator is low if the value provided from the at least one pin is less than the second reference value (e.g., $V_{sensed} < V_{RefTwo}$).

When the result of the comparison in step 1414 is high, meaning that the value provided from the pin exceeds the second reference value, the method proceeds to step 1416 if quick discharge (step 1408) was performed earlier. However, if quick charge (step 1410) was performed, then the method proceeds to step 1418, where a switch is made to classical margining mode.

At 1416, the quick discharge mode is continued and the active segments all remain in a pulled-down state. The method then returns to step 1412, which is followed by step 1414. Execution of the pull-down activity is continued for a period of time until the comparison at step 1414 outputs a low, or zero, value.

When the result of the comparison at step 1414 is low, meaning that the value provided from the pin is less than the second reference value, the method proceeds to classical margining (step 1418) if quick discharge (step 1408) was performed earlier. However, if quick charge (step 1410) was performed, then the method proceeds to step 1420.

At 1420, the quick charge mode is continued and the active segments all remain in a pulled-up state. The method then returns to step 1412 followed by step 1414. Execution of the pull-up activity in accordance with step 1420 is continued for a period of time until the comparison at step 1414 outputs a high, or logical 1, value. The comparison at step 1414 may be repeated at a preset interval until a condition for proceeding to step 1418 is satisfied.

Once a switch is made to classical margining (step 1418), charging continues according to classical margining until the common mode has been re-established (step 1422). The re-establishment can be detected by changing the comparator reference back to the first value and performing further comparisons. Alternatively, the classical margining may be applied for a predefined period of time sufficient to guarantee re-establishment, thereby avoiding a need for further comparisons. After being re-established, the common mode may be maintained by an idle circuit, allowing the H-bridges to be de-activated. The idle circuit may include a high impedance and/or low power consumption resistive bridge. Alternatively, the common mode may be maintained by setting the H-bridges to a low power configuration.

In the foregoing Description of Exemplary Embodiments, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Exemplary Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A method for re-establishing a common mode in a transmitter device, the method comprising:
   responsive to a request to establish an electrical idle state, sensing an output of the transmitter device;
   comparing the output or a value derived from the output to a first reference value, wherein the first reference value corresponds to a common mode voltage;
   reconfiguring a driver circuit in the transmitter device to operate according to a quick charge mode or a quick discharge mode depending on a result of the comparing, wherein the reconfiguring adjusts the output towards the common mode voltage; and
   after the reconfiguring, switching the driver circuit to a classical margining mode in response to detecting that the output has passed the common mode voltage, wherein the classical margining mode brings the output back towards the common mode voltage, wherein more pull-up segments and less pull-down segments are activated in the quick charge mode than the classical margining mode, and wherein more pull-down segments and less pull-up segments are activated in the quick discharge mode than the classical margining mode.

2. The method of claim 1, wherein each pull-up segment includes at least one PMOS transistor, and wherein each pull-down segment includes at least one NMOS transistor.

3. The method of claim 1, further comprising:
   detecting that the output has passed the common mode voltage by comparing the output or the value derived from the output to a second reference value, wherein the second reference value is greater than the first reference value if the driver circuit is reconfigured to the quick charge mode, and wherein the second reference value is less than the first reference value if the driver circuit is reconfigured to the quick discharge mode.

4. The method of claim 3, wherein the comparing to the second reference value occurs after a period of time has passed since the driver circuit was reconfigured to the quick charge mode or the quick discharge mode.

5. The method of claim 3, wherein the driver circuit is reconfigured to the quick charge mode, and wherein the comparing to the second reference value is repeated until the output or the value derived from the output is greater than the second reference value.

6. The method of claim 3, wherein the driver circuit is reconfigured to the quick discharge mode, and wherein the comparing to the second reference value is repeated until the output or the value derived from the output is less than the second reference value.

7. The method of claim 1, further comprising:
after the common mode is re-established, using the comparator to detect a presence or an absence of a receiver device.

8. A system for re-establishing a common mode in a transmitter device, the system comprising:
a receiver device; and
the transmitter device, wherein the transmitter device outputs to a channel connecting the transmitter device and the receiver device, and includes:
a reconfigurable driver circuit that contributes to an output of the transmitter device and is reconfigurable to switch between a quick charge mode, a quick discharge mode and a classical margining mode by selectively activating pull-up and pull-down segments of the driver circuit, wherein more pull-up segments and less pull-down segments are activated in the quick charge mode than the classical margining mode, and wherein more pull-down segments and less pull-up segments are activated in the quick discharge mode than the classical margining mode;
a comparator that compares the output or a value derived from the output to a first reference value corresponding to a common mode voltage; and
a controller that adjusts the output towards the first reference value by switching the driver circuit to the quick charge mode or the quick discharge mode depending on a result of the comparing, wherein after the reconfiguring, the controller switches the driver circuit to the classical margining mode in response to detecting that the output has passed the common mode voltage, and wherein the classical margining mode brings the output back towards the common mode voltage.

9. The system of claim 8, wherein the controller includes a state machine that determines which of a plurality of potential reference values is used by the comparator.

10. The system of claim 9, further comprising:
a digital-to-analog converter (DAC) that converts a digital code transmitted by the state machine, therein generating the reference value used by the comparator.

11. The system of claim 8, wherein:
the output of the transmitter device is formed by a plurality of outputs from the driver circuit;
the comparator compares the value derived from the output of the transmitter device to the first reference value; and
the transmitter device generates the value derived from the output of the transmitter device by averaging the outputs from the driver circuit.

12. The system of claim 8, wherein each pull-up segment includes at least one PMOS transistor, and wherein each pull-down segment includes at least one NMOS transistor.

13. The system of claim 8, wherein the controller is configured to detect that the output has passed the common mode voltage by setting the comparator to compare the output or the value derived from the output to a second reference value, wherein the second reference value is greater than the first reference value if the driver circuit is reconfigured to the quick charge mode, and wherein the second reference value is less than the first reference value if the driver circuit is reconfigured to the quick discharge mode.

14. A control circuit for re-establishing a common mode in a transmitter device, wherein the control circuit is configured to:
switch a reconfigurable driver circuit in the transmitter device between a quick charge mode, a quick discharge mode and a classical margining mode by selectively activating pull-up and pull-down segments of the driver circuit, wherein more pull-up segments and less pull-down segments are activated in the quick charge mode than the classical margining mode, and wherein more pull-down segments and less pull-up segments are activated in the quick discharge mode than the classical margining mode;
adjust the output towards a common mode voltage by switching the reconfigurable circuit to the quick charge mode or the quick discharge mode; and
bring the output back towards the common mode voltage by switching the driver circuit to the classical margining mode in response to detecting that the output has passed the common mode voltage.

15. The control circuit of claim 14, wherein the control circuit is configured to:
switch to the quick charge mode or the quick discharge mode based on an output of a comparator that compares the output of the transmitter device or a value derived from the output of the transmitter device to a first reference value, wherein the first reference value corresponds to the common mode voltage, and wherein the control circuit changes the first reference value to a second reference value when switching to the quick charge mode or the quick discharge mode.

16. The control circuit of claim 15, wherein:
the second reference value is greater than the first reference value if the driver circuit is reconfigured to the quick charge mode; and
the second reference value is less than the first reference value if the driver circuit is reconfigured to the quick discharge mode.

17. The control circuit of claim 14, wherein the pull-up segments and the pull-down segments form an H-bridge.

18. The control circuit of claim 14, wherein in the quick charge mode, a sufficient number of pull-up segments are activated such that if the quick charge mode were maintained, the output would eventually settle at a rail voltage of the transmitter device.

19. The control circuit of claim 18, wherein the common mode voltage is half the rail voltage.

20. The control circuit of claim 14, wherein in the quick charge mode, no pull-down segments are activated, and wherein in the quick discharge mode, no pull-up segments are activated.

* * * * *